(12) United States Patent
Yang

(10) Patent No.: US 12,268,028 B2
(45) Date of Patent: Apr. 1, 2025

(54) METHOD OF FABRICATING SEMICONDUCTOR DEVICE

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/395,616

(22) Filed: Dec. 24, 2023

(65) Prior Publication Data

US 2024/0136417 A1    Apr. 25, 2024

Related U.S. Application Data

(60) Division of application No. 17/955,526, filed on Sep. 28, 2022, now Pat. No. 11,894,434, which is a continuation of application No. 17/148,539, filed on Jan. 13, 2021, now Pat. No. 11,563,096.

(30) Foreign Application Priority Data

Dec. 1, 2020  (CN) .................... 202011384166.X

(51) Int. Cl.
| | | |
|---|---|---|
| H10D 64/01 | (2025.01) | |
| H10D 30/01 | (2025.01) | |
| H10D 30/47 | (2025.01) | |
| H10D 62/10 | (2025.01) | |
| H10D 64/23 | (2025.01) | |

(52) U.S. Cl.
CPC ......... *H10D 64/258* (2025.01); *H10D 30/015* (2025.01); *H10D 30/475* (2025.01); *H10D 62/102* (2025.01); *H10D 64/01* (2025.01)

(58) Field of Classification Search
CPC ........... H01L 29/41775; H01L 29/0607; H01L 29/401; H01L 29/66462; H01L 29/7786; H01L 29/0653; H01L 29/402; H01L 29/41766; H01L 29/1066; H01L 29/2003; H01L 29/42344; H01L 27/11573; H01L 27/11568; H01L 29/792; H01L 29/66833
See application file for complete search history.

(56) References Cited

U.S. PATENT DOCUMENTS

| | | |
|---|---|---|
| 8,604,516 B2 | 12/2013 | Wakita |
| 8,785,976 B2 | 7/2014 | Nakajima |
| 2007/0018199 A1 | 1/2007 | Sheppard |
| 2008/0237610 A1 | 10/2008 | Imanishi |

(Continued)

*Primary Examiner* — Moin M Rahman
(74) *Attorney, Agent, or Firm* — Winston Hsu

(57) ABSTRACT

A method of fabricating a semiconductor device includes the following steps. A substrate is provided. A semiconductor channel layer is formed on the substrate. A semiconductor barrier layer is formed on the semiconductor channel layer. An etching process is performed to expose a portion of the semiconductor channel layer. A dielectric layer is formed to cover the semiconductor barrier layer and the exposed semiconductor channel layer. A first electrode is formed after forming the dielectric layer, where the first electrode includes a body portion and a vertical extension portion, the body portion is electrically connected to the semiconductor barrier layer, and a bottom surface of the vertical extension portion is lower than a top surface of the semiconductor channel layer.

6 Claims, 6 Drawing Sheets

(56) References Cited

U.S. PATENT DOCUMENTS

| | | |
|---|---|---|
| 2019/0229203 A1 | 7/2019 | Iucolano |
| 2020/0105917 A1 | 4/2020 | Okita |
| 2020/0185514 A1 | 6/2020 | Chen |
| 2021/0111254 A1 | 4/2021 | Jones |
| 2021/0265338 A1 | 8/2021 | Zhao |
| 2021/0320196 A1 | 10/2021 | Chou |
| 2021/0336016 A1 | 10/2021 | Hsieh |
| 2021/0367069 A1* | 11/2021 | Rigaud-Minet ....... H01L 29/205 |

* cited by examiner

METHOD OF FABRICATING SEMICONDUCTOR DEVICE

CROSS REFERENCE TO RELATED APPLICATIONS

This application is a division of U.S. application Ser. No. 17/955,526, filed on Sep. 28, 2022, which is a continuation application of U.S. application Ser. No. 17/148,539, filed on Jan. 13, 2021. The contents of these applications are incorporated herein by reference.

BACKGROUND OF THE INVENTION

1. Field of the Invention

The present invention relates to the field of semiconductor devices, and more particularly to high electron mobility transistors and fabricating method thereof.

2. Description of the Prior Art

In semiconductor technology, group III-V semiconductor compounds may be used to form various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different band gaps (i.e., a heterojunction). The 2-DEG layer is used as the transistor channel instead of a doped region, as is generally the case for metal oxide semiconductor field effect transistors (MOSFETs). Compared with MOSFETs, HEMTs have a number of attractive properties such as high electron mobility and the ability to transmit signals at high frequencies. However, there is still a need to improve the breakdown voltage ($V_{BR}$) of conventional HEMTs in order to meet the requirements of the industry.

SUMMARY OF THE INVENTION

In view of this, it is necessary to provide an improved high electron mobility transistor so as to meet the requirements of the industry.

According to one embodiment of the present invention, a semiconductor device is disclosed and includes a substrate, a semiconductor channel layer, a semiconductor barrier layer, a gate electrode, a first electrode, and a dielectric layer. The semiconductor channel layer is disposed on the substrate, and the semiconductor barrier layer is disposed on the semiconductor channel layer. The gate electrode is disposed on the semiconductor barrier layer. The first electrode is disposed at one side of the gate electrode. The first electrode includes a body portion and a vertical extension portion. The body portion is electrically connected to the semiconductor barrier layer, and the bottom surface of the vertical extension portion is lower than the top surface of the semiconductor channel layer. The dielectric layer is disposed between the vertical extension portion and the semiconductor channel layer.

According to one embodiment of the present disclosure, a method of fabricating a semiconductor device is disclosed and includes the following steps: providing a substrate; forming a semiconductor channel layer on the substrate; forming a semiconductor barrier layer on the semiconductor channel layer; performing an etching process to expose a portion of the semiconductor channel layer; forming a dielectric layer covering the semiconductor barrier layer and the exposed semiconductor channel layer; and forming a first electrode after forming the dielectric layer, where the first electrode comprises a body portion and a vertical extension portion, the body portion is electrically connected to the semiconductor barrier layer, and a bottom surface of the vertical extension portion is lower than a top surface of the semiconductor channel layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present invention are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
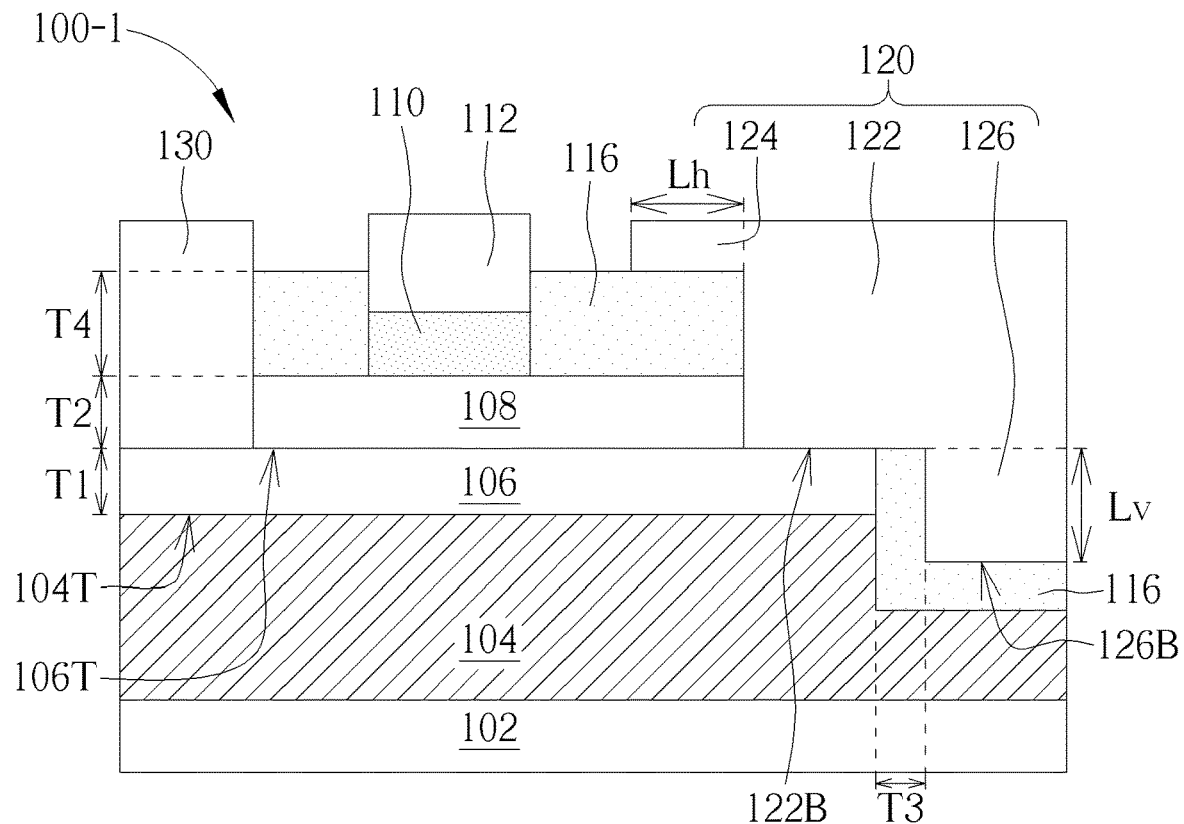
FIG. 1 is a schematic cross-sectional diagram of a semiconductor device according to one embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device, and certain elements in various drawings may not be drawn to scale. In addition, the number and dimension of each device shown in drawings are only illustrative and are not intended to limit the scope of the present disclosure.

Certain terms are used throughout the following description to refer to particular components. One of ordinary skill in the art would understand that electronic equipment manufacturers may use different technical terms to describe the same component. The present disclosure does not intend to distinguish between the components that differ only in name but not function. In the following description and claims, the terms "include", "comprise", and "have" are used in an open-ended fashion and thus should be interpreted as the meaning of "include, but not limited to".

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

When an element or layer is referred to as being "coupled to" or "connected to" another element or layer, it may be directly coupled or connected to the other element or layer, or intervening elements or layers may be presented. In contrast, when an element is referred to as being "directly coupled to" or "directly connected to" another element or layer, there are no intervening elements or layers presented.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means in 10%, 5%, 1%, or 0.5% of a given value or range. Alternatively, the term "about" means in an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that may vary as desired. At the very least, each numerical parameter should at least be construed in light of the number of reported significant digits and by applying ordinary rounding techniques. Ranges may be expressed herein as from one endpoint to another endpoint or between two endpoints. All ranges disclosed herein are inclusive of the endpoints, unless specified otherwise.

It should be noted that the technical features in different embodiments described in the following may be replaced, recombined, or mixed with one another to constitute another embodiment without departing from the spirit of the present invention.

The present invention is directed to a high electron mobility transistor (HEMT) and method for fabricating the same, where HEMTs may be used as power switching transistors for voltage converter applications. Compared to silicon power transistors, group III-V HEMTs feature low on-state resistances and low switching losses due to wide bandgap properties. In the present disclosure, a "group III-V semiconductor" is referred to as a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), and the like, or a combination thereof. In a similar manner, an "III-nitride semiconductor" is referred to as a compound semiconductor that includes nitrogen and at least one group III element, such as, but not limited to, GaN, aluminum nitride (AlN), indium nitride (InN), AlGaN, InGaN, InAlGaN, and the like, or a combination thereof, but is not limited thereto.

FIG. 1 is a schematic cross-sectional diagram of a semiconductor device according to one embodiment of the present disclosure. Referring to FIG. 1, a semiconductor device 100-1 includes at least a substrate 102, a semiconductor channel layer 106, a semiconductor barrier layer 108, a gate electrode 112, and a dielectric layer 116. The semiconductor channel layer 106 is disposed on the substrate 102, the semiconductor barrier layer 108 is disposed on the semiconductor channel layer 106, and the gate electrode 112 is disposed on the semiconductor barrier layer 108. The first electrode 120 is disposed at one side of the gate electrode 112, where the first electrode 120 may include a body portion 122, a vertical extension portion 126, and an optional horizontal extension portion 124. The body portion 122 may be electrically connected to the vertical extension portion 126 and the horizontal extension portion 124, and the body portion 122 may be electrically connected to the semiconductor barrier layer 106. A bottom surface 126B of the vertical extension portion 126 is lower than a top surface 106T of the semiconductor channel layer 106. In addition, the dielectric layer 116 may be disposed between the vertical extension portion 126 and the semiconductor channel layer 106. Furthermore, according to one embodiment of the present disclosure, the semiconductor device 100-1 may further include a buffer layer 104, a gate capping layer 110 and a second electrode 130. The semiconductor buffer layer 104 may be disposed between the substrate 102 and the semiconductor channel layer 106, which may be used to reduce leakage current between the substrate 102 and the semiconductor channel layer 106, or to reduce stress accumulation or lattice mismatch between the substrate 102 and the semiconductor channel layer 106. The gate capping layer 110 may be disposed between the semiconductor barrier layer 108 and the gate electrode 112. The first electrode 120 and the second electrode 130 may be disposed at both sides of the gate electrode 112, respectively. According to one embodiment of the present disclosure, a two-dimensional electron gas (2-DEG) may be generated at the junction of the semiconductor channel layer 106 and the semiconductor barrier layer 108. By providing the gate capping layer 110, two-dimensional electron gas will not be generated in the corresponding semiconductor channel layer 106 below it, so that part of the two-dimensional electron gas will be cut off.

According to one embodiment of the present invention, the substrate 102 may be a bulk silicon substrate, a silicon carbide (SiC) substrate, a sapphire substrate, a silicon on insulator (SOI) substrate, or a germanium on insulator (GOI) substrate, but not limited thereto. The stacked layers on the substrate 102 may be formed by performing any suitable processes, such as molecular-beam epitaxy (MBE), metal organic chemical vapor deposition (MOCVD), hydride vapor phase epitaxy (HVPE), atomic layer deposition (ALD), or other suitable methods, to thereby form the buffer layer 104, the semiconductor channel layer 106, the semiconductor barrier layer 108, and the gate capping layer 110 disposed on the substrate 102.

The buffer layer 104 may include a plurality of sub-semiconductor layers (i.e., multiple layers) and the overall resistance of the buffer layer 104 may be higher than the resistance of other layers on the substrate 102. Specifically, the ratio of some elements, such as metal element, of the buffer layer 104 may be changed gradually along a direction from the substrate 102 to the semiconductor channel layer 106. For example, for a case where the substrate 102 and the semiconductor channel layer 106 are a silicon substrate and a GaN layer, respectively, the buffer layer 104 may be graded aluminum gallium nitride ($Al_xGa_{(1-x)}N$) where there is a continuous or stepwise decrease in the x ratio from 0.9 to 0.15 along the direction from the substrate 102 to the semiconductor channel layer 106. In another case, the buffer layer 104 may have a superlattice structure.

The semiconductor channel layer 106 may include one or more layers of group III-V semiconductor composed of GaN, AlGaN, InGaN, or InAlGaN, but not limited thereto. In addition, the semiconductor channel layer 106 may also be one or more layers of doped group III-V semiconductor, such as p-type III-V semiconductor. For the p-type group III-V semiconductor, the dopants of which may be C, Fe, Mg or Zn, but not limited thereto. The thickness of the semiconductor channel layer 106 may range from 50 nm to 350 nm, such as 200 nm, but not limited thereto.

The semiconductor barrier layer 108 may include one or more layers of group III-V semiconductor with the composition different from that of the group III-V semiconductor of the semiconductor channel layer 106. For example, the semiconductor barrier layer 108 may include AlN, $Al_yGa_{(1-y)}N$ (0<y<1), or a combination thereof. In accordance with one embodiment, the semiconductor channel layer 106 may be an undoped GaN layer, and the semiconductor barrier layer 108 may be an inherent n-type AlGaN layer. Since there is a bandgap discontinuity between the semiconductor channel layer 106 and the semiconductor barrier layer 108, by stacking the semiconductor channel layer 106 and the semiconductor barrier layer 108 on each other (and vice versa), a thin layer with high electron mobility, also called a two-dimensional electron gas, may be accumulated near the heterojunction between the semiconductor channel layer 106 and the semiconductor barrier layer 108 due to the piezoelectric effect.

The dielectric layer 116, or passivation layer, may be disposed along the surface of the semiconductor barrier layer 108 and between the vertical extension portion 126 of the first electrode 120 and the semiconductor channel layer 106, or further between the horizontal extension portion 124 of the first electrode 120 and the semiconductor barrier layer 108. The thicknesses of the dielectric layers 116 disposed in different regions may be the same or different. For example, the dielectric layer 116 between the vertical extension portion 126 and the semiconductor channel layer 106 may have a thickness T3, while the dielectric layer 116 between the horizontal extension portion 124 and the semiconductor barrier layer 108 may have a thickness T4. The thickness T3 and the thickness T4 may be each slightly thinner than the thickness Ti of semiconductor barrier layer 108, and the thickness T3 and the thickness T4 may be the same or different. According to one embodiment of the present disclosure, the dielectric layer 116 may directly contact the semiconductor channel layer 106 and the vertical extension portion 126 of the first electrode 122. The dielectric layer 116 may cover the sidewall and the bottom surface 126B of the vertical extension portion 126, and the thickness T3 of the dielectric layer 116 may be less than the vertical length Lv of the vertical extension portion 126. The composition of the dielectric layer 116 may include dielectric material, such as a high dielectric constant (high-k) material with a dielectric constant greater than 4. The material of the high-k dielectric may be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST), or a combination thereof.

The gate capping layer 110 may include one or more layers of group III-V semiconductor with the composition different from that of the group III-V semiconductor of the semiconductor barrier layer 108, such as p-type III-V semiconductor. For the p-type group III-V semiconductor, the dopants of which may be C, Fe, Mg or Zn, but not limited thereto. According to one embodiment of the present invention, the gate capping layer 110 may be a p-type GaN layer.

According to one embodiment of the present disclosure, the body portion 122 of the first electrode 120 may be in direct contact with and electrically connected to the semiconductor barrier layer 106. The bottom surface 122B of the body portion 122 may be level with or deeper than the top surface 106T of the semiconductor channel layer 106. The vertical extension portion 126 of the first electrode 120 may extend downward from the bottom surface 122B of the body portion 122, so that the bottom surface 126B of the vertical extension portion 126 may be lower than the top surface 104T of the semiconductor buffer layer 104. The vertical length Lv of the vertical extension portion 126 may be 0.5 μm to 3 μm, but not limited thereto. In addition, since the dielectric layer 116 is disposed between the vertical extension portion 126 and the underlying layers (i.e., the semiconductor channel layer 106 and the semiconductor buffer layer 104), it is possible to prevent current from flowing from the vertical extension portion 126 into the semiconductor channel layer 106 or the semiconductor buffer layer 104. The horizontal extension portion 124 of the first electrode 120 may extend from one side of the body portion 122 toward the gate electrode 112. The horizontal length Lh of the horizontal extension portion 124 may be 0.5 µm to 3 µm, but not limited thereto. In addition, since the dielectric layer 116 is disposed between the horizontal extension portion 124 and the semiconductor barrier layer 108, it is possible to prevent current from flowing from the horizontal extension portion 124 into the semiconductor barrier layer 108. The first electrode 120, the second electrode 130, and the gate electrode 112 may be single-layer or multi-layer structures, and their compositions can include low-resistance semiconductors, metals, or alloys, such as Al, Cu, W, Au, Pt, Ti, and polysilicon, but not limited thereto. In addition, the first electrode 120 and the second electrode 130 may form ohmic contact with the underlying semiconductor channel layer 106.

According to one embodiment, when operating the semiconductor device 100-1, the first electrode 120 may be, for example, a drain electrode electrically connected to an external high voltage (e.g., 10V-200V), while the second electrode 130 may be, for example, a source electrode electrically connected to an external voltage of lower voltage (e.g., 0V), but is not limited thereto. According to one embodiment of the present disclosure, the first electrode 120 may be, for example, a source electrode, and the second electrode 130 may be, for example, a drain electrode. By applying appropriate bias voltages to the first electrode 120 and the second electrode 130, current can flow into or out of the semiconductor device 100-1. In addition, by applying an appropriate bias voltage to the gate electrode 112, the conductivity of the channel region below the gate electrode 112 may be adjusted, so that current can flow between the first electrode 120 and the second electrode 130.

In addition, the semiconductor device 100-1 may further include an interlayer dielectric layer covering the first electrode 120, the second electrode 130, and the gate electrode 112. According to one embodiment of the present disclosure, contact holes may be provided in the interlayer dielectric layer for accommodating contact plugs respectively. The contact plugs may be electrically connected to the first electrode 120, the second electrode 130, and the gate electrode 112, respectively.

In addition to the above embodiments, the present invention may further include other modifications about semiconductor devices. For the sake of simplicity, the description below is mainly focused on differences among these embodiments. In addition, the present invention may repeat reference numerals and/or letters in the various modifications and variations. This repetition is for the purpose of simplicity and clarity and does not in itself dictate a relationship between the various embodiments and/or configurations discussed.

Figure 2:
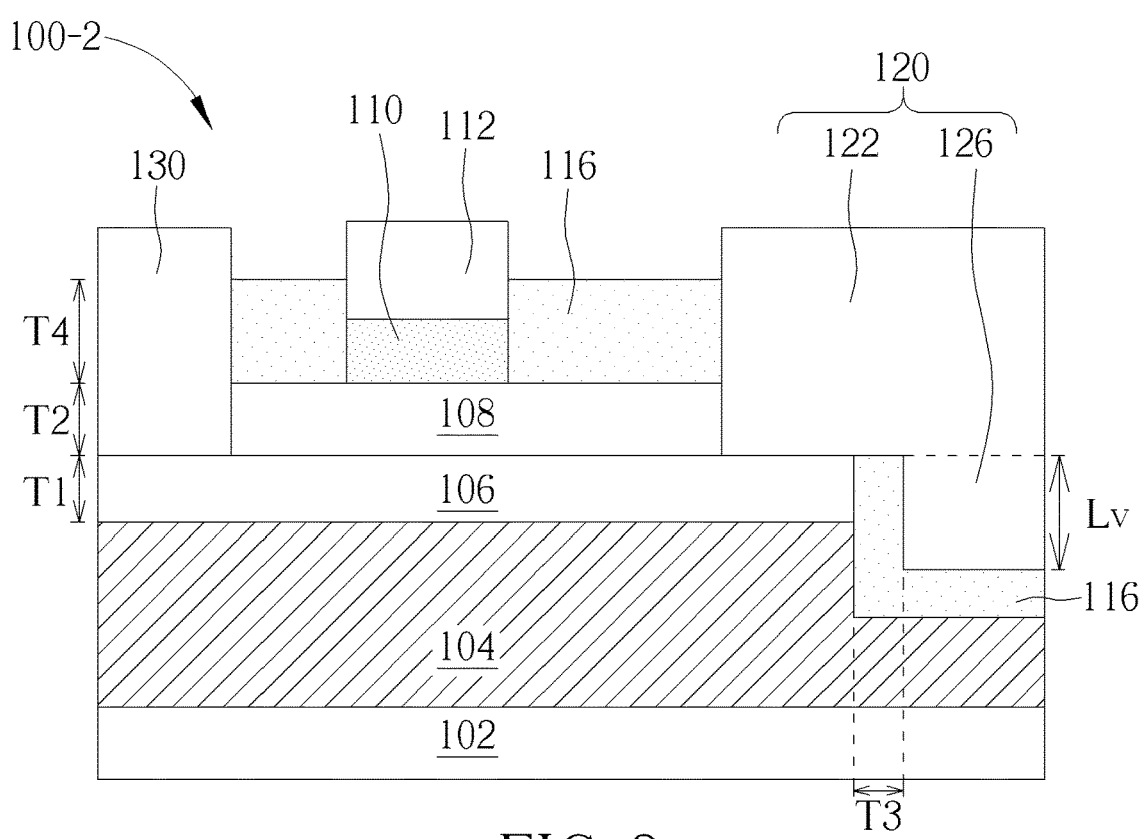
FIG. 2 is a schematic cross-sectional diagram of a semiconductor device with a vertical extension portion according to a modified embodiment of the present disclosure.

FIG. 2 is a schematic cross-sectional diagram of a semiconductor device with a vertical extension portion according to a modified embodiment of the present disclosure. Referring to FIG. 2, the structure of the semiconductor device 100-2 is similar to that of the semiconductor device 100-1 shown in the embodiment of FIG. 1, with the main difference in that the first electrode 120 does not include a horizontal extension portion.

Figure 3:
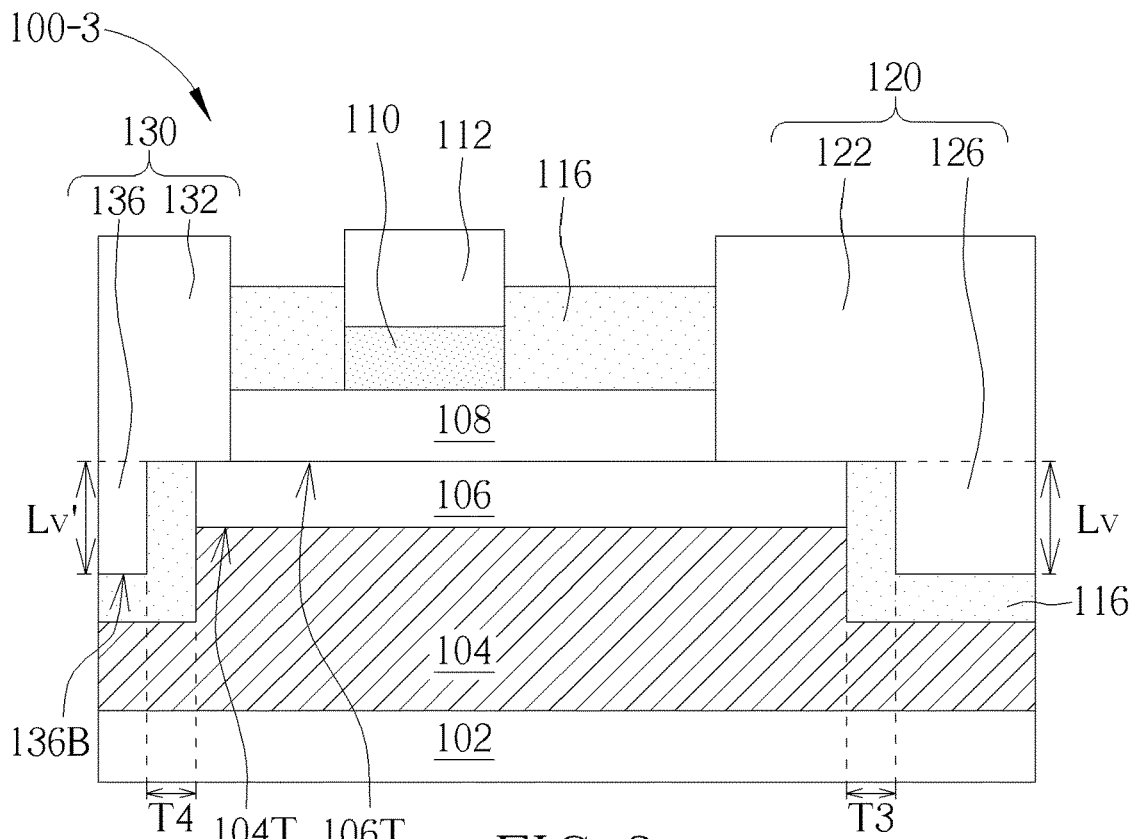
FIG. 3 is a schematic cross-sectional diagram of a semiconductor device with a vertical extension portion according to a modified embodiment of the present disclosure.

FIG. 3 is a schematic cross-sectional diagram of a semiconductor device with a vertical extension portion according to a modified embodiment of the present disclosure. Referring to FIG. 3, the structure of the semiconductor device 100-3 is similar to that of the semiconductor device 100-1 shown in the embodiment of FIG. 1. The main difference between these two embodiments is that the second electrode 130 of the semiconductor device 100-3 includes a body portion 132 and a vertical extension portion 136. The body portion 132 may be electrically connected to the semiconductor barrier layer 106. The vertical extension portion 136 may extend downward from the bottom surface of the body portion 132, so that the bottom surface 136B of the vertical extension portion 136 may be lower than the top surface 104T of the semiconductor buffer layer 104. The vertical length Lv of the vertical extension portion 126 may be 0.5 µm to 3 µm, but not limited thereto. In addition, since the dielectric layer 116 is disposed between the vertical extension portion 136 and the underlying layers (i.e., the semiconductor channel layer 106 and the semiconductor buffer layer 104), it is possible to prevent current from flowing from the vertical extension portion 126 into the semiconductor channel layer 106 or the semiconductor buffer layer 104. According to the embodiment shown in FIG. 3, one of the first electrode 120 and the second electrode 130 may be a source electrode, and the other one of the first electrode 120 and the second electrode 130 may be a drain electrode, so either the source electrode or the drain electrode may have vertical extension portions 126, 136.

Figure 4:
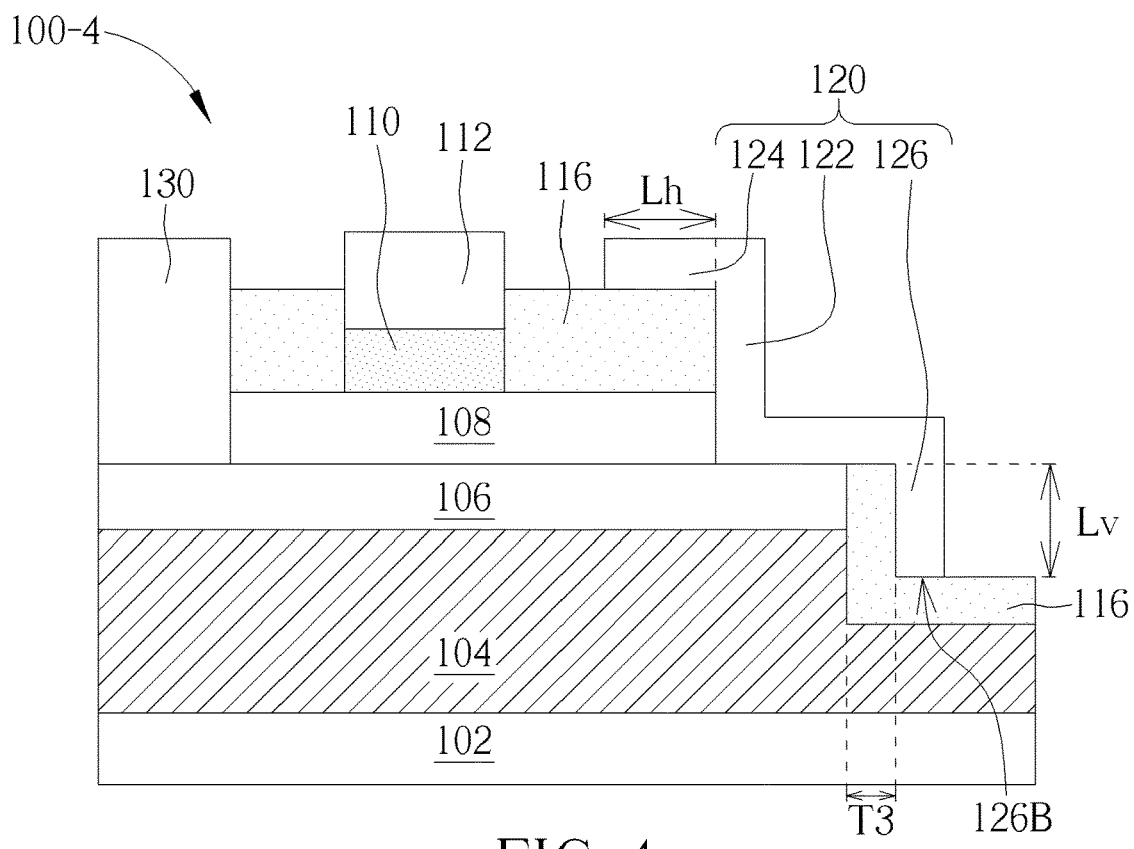
FIG. 4 is a schematic cross-sectional diagram of a semiconductor device with a conformal dielectric layer according to a modified embodiment of the present disclosure.

FIG. 4 is a schematic cross-sectional diagram of a semiconductor device with a conformal dielectric layer according to a modified embodiment of the present disclosure. Referring to FIG. 4, the structure of the semiconductor device 100-4 is similar to that of the semiconductor device 100-1 shown in the embodiment of FIG. 1, the main difference is that the body portion 132, the horizontal extension portion 124 and the vertical extension portion 126 of the first electrode 120 conformally cover the dielectric layer 116 and the semiconductor barrier layer 106.

In order to enable one of ordinary skill in the art to implement the present disclosure, some embodiments of a method of fabricating a semiconductor device is further described below.

Figure 5:
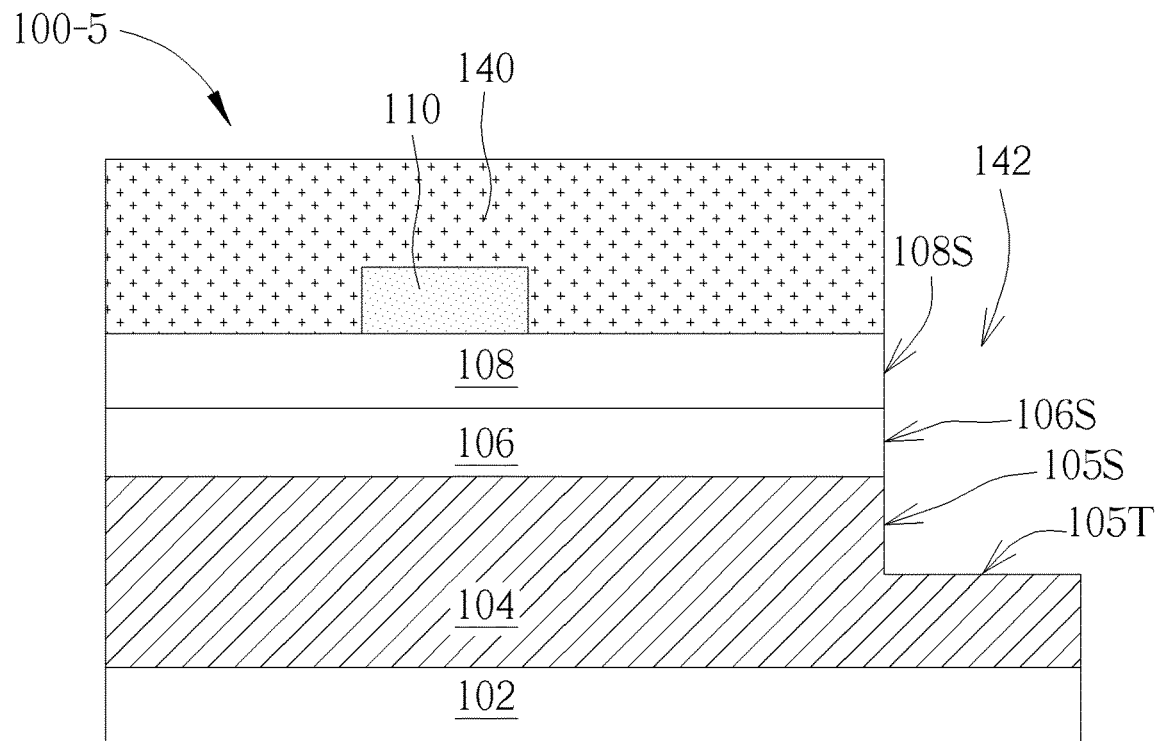
FIG. 5 is a schematic cross-sectional diagram of a structure after a recess is formed in a semiconductor buffer layer according to one embodiment of the present disclosure.

FIG. 5 is a schematic cross-sectional diagram of a structure after a recess is formed in a semiconductor buffer layer according to one embodiment of the present disclosure. Referring to FIG. 5, a semiconductor buffer layer 104, a semiconductor channel layer 106, a semiconductor barrier layer 108, and a gate capping layer 110 may be sequentially formed on a substrate 102 to obtain a semiconductor structure 100-5. Thereafter, a patterned mask 140 may be formed, and the semiconductor barrier layer 108, the semiconductor channel layer 106, and the semiconductor buffer layer 104 exposed from the patterned mask 140 may be etched to form a recess 142. The recess 142 may expose the sidewall 108S of the semiconductor barrier layer 108, the sidewall 106S of the semiconductor channel layer 106, and the vertical surface 105S and the horizontal surface 105T of the semiconductor buffer layer 104. Subsequently, the patterned mask 140 may be further removed.

Figure 6:
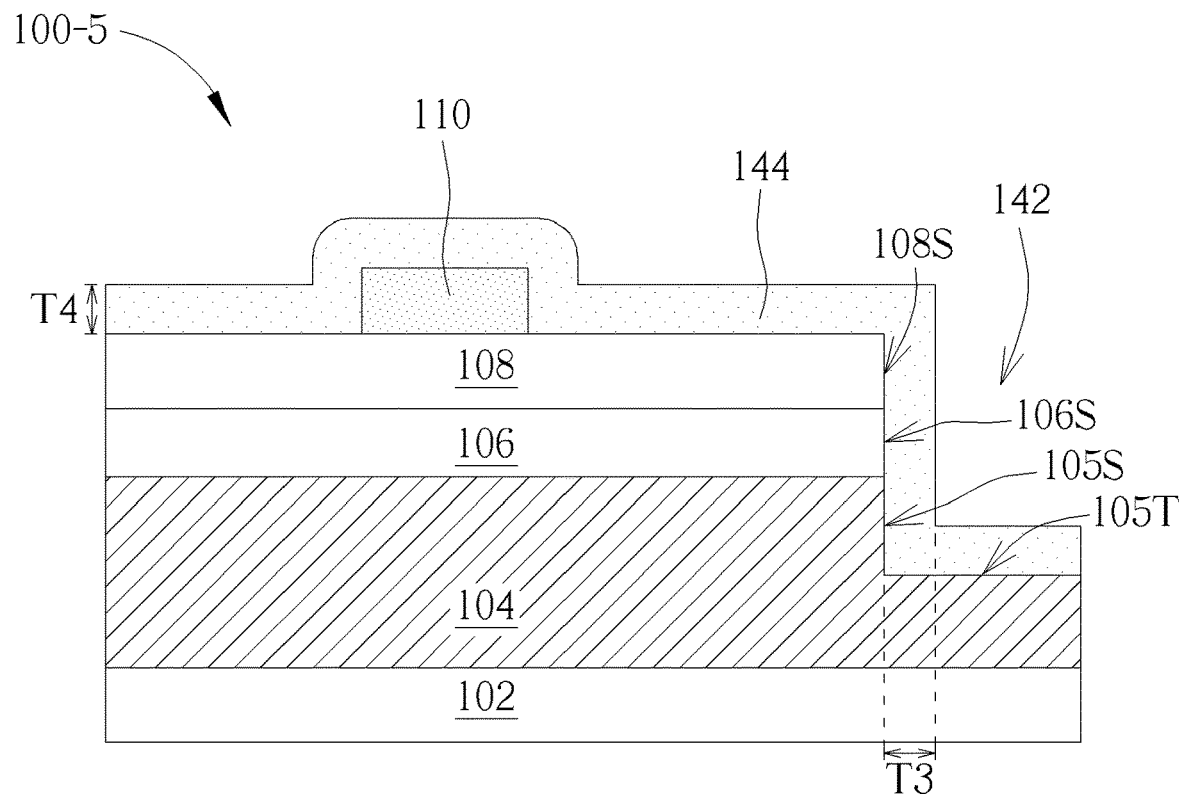
FIG. 6 is a schematic cross-sectional diagram of a structure after forming a dielectric layer according to one embodiment of the present disclosure.

FIG. 6 is a schematic cross-sectional diagram of a structure after forming a dielectric layer according to one embodiment of the present disclosure. Referring to FIG. 6, a dielectric layer 144 may be deposited to conformally cover the gate capping layer 110, the sidewall 108S of the semiconductor barrier layer 108, the sidewall 106S of the semiconductor channel layer 106, and the vertical surface 105S and the horizontal surface 105T of the semiconductor buffer layer 104. In a subsequent process, the dielectric layer 144 may be further etched to thereby form the dielectric layer 116 disclosed in the above embodiment.

Figure 7:
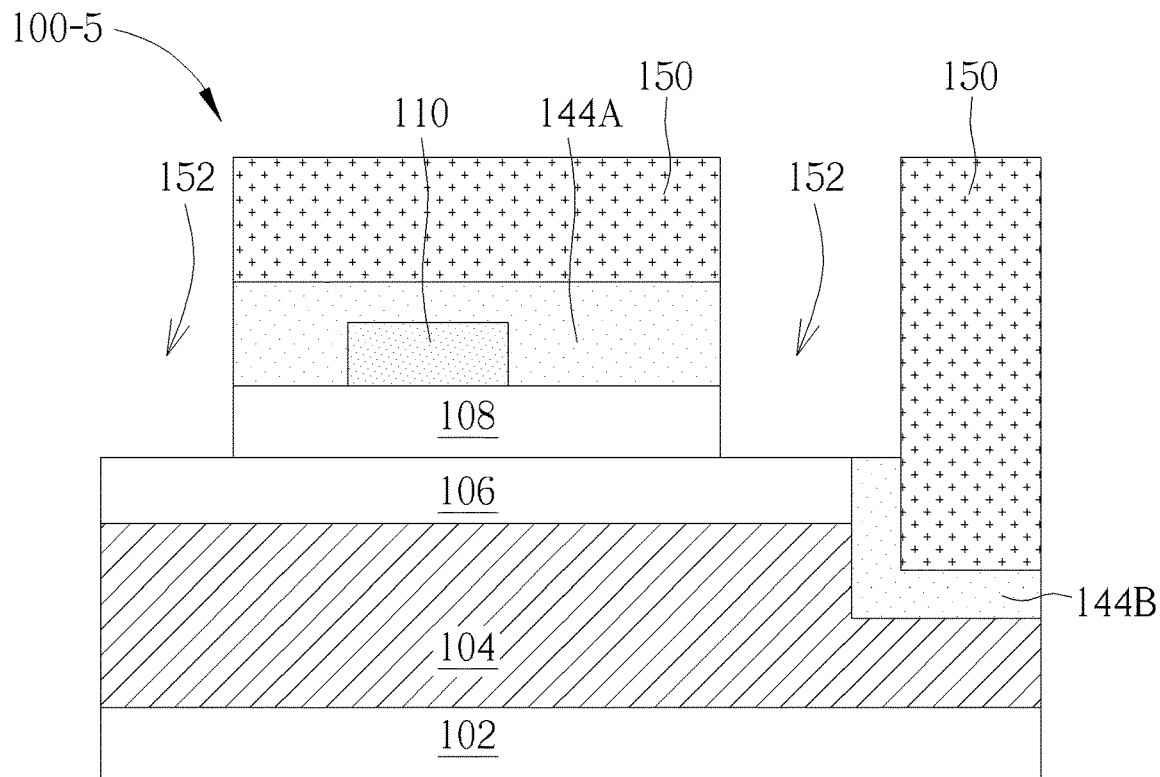
FIG. 7 is a schematic cross-sectional diagram of the structure after etching part of the dielectric layer according to one embodiment of the present disclosure.

FIG. 7 is a schematic cross-sectional diagram of the structure after etching part of the dielectric layer according to one embodiment of the present disclosure. Referring to FIG. 7, a patterned mask 150 may be formed, and the dielectric layer 144 and the semiconductor barrier layer 108 exposed from the patterned mask 150 may be etched to thereby form dielectric layers 144A, 144B separated from one another as well as recesses 152 at both sides of the gate capping layer 110. The bottom surface of the recess 152 may be level with or lower than the top surface of the semiconductor channel layer 106.

Figure 8:
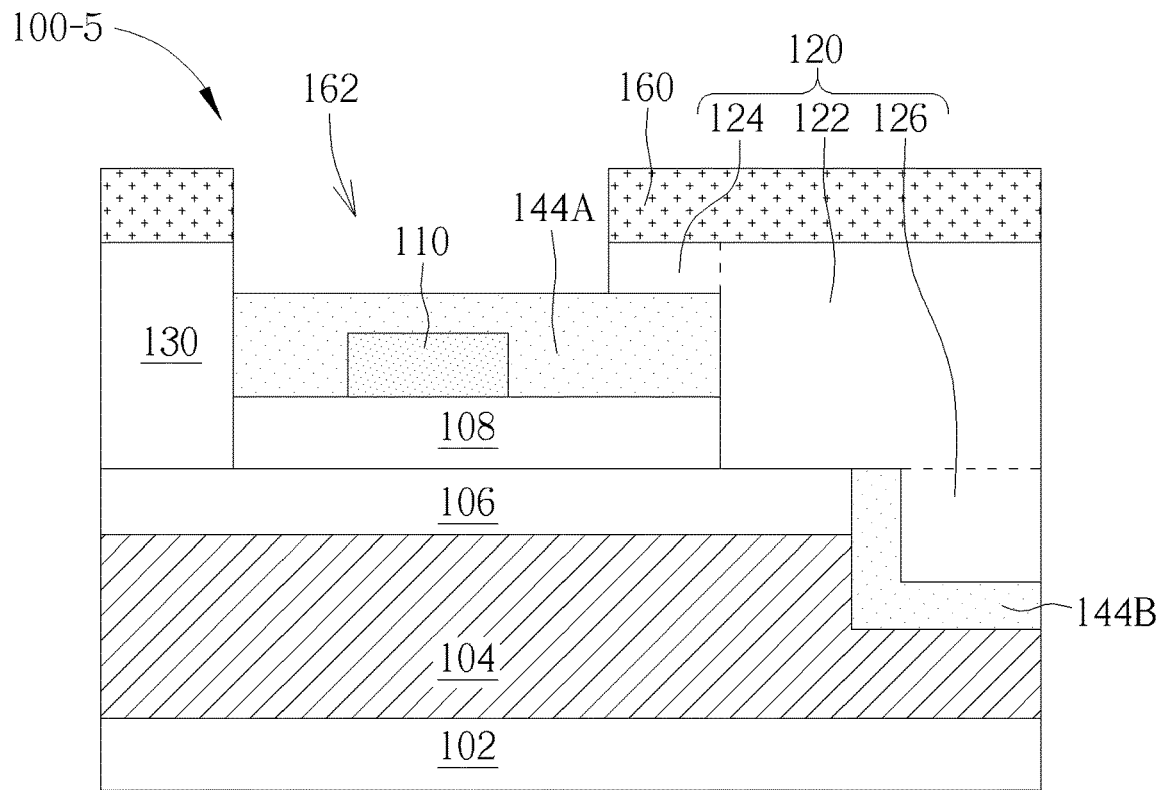
FIG. 8 is a schematic cross-sectional diagram of a structure after forming a conductive electrode according to one embodiment of the present disclosure.

FIG. 8 is a schematic cross-sectional diagram of a structure after forming a conductive electrode according to one embodiment of the present disclosure. After the process shown in FIG. 7, a conductive layer filling up the recess 152 may be formed by appropriate deposition and etching processes. Thereafter, a patterned mask 160 having an opening pattern 162 may be formed, and the conductive layer exposed from the opening pattern 162 may be etched to thereby form separated conductive layers, e.g., a first electrode 120 and a second electrode 130. The first electrode 120 includes a body portion 122, a horizontal extension portion 124, and a vertical extension portion 126.

Figure 9:
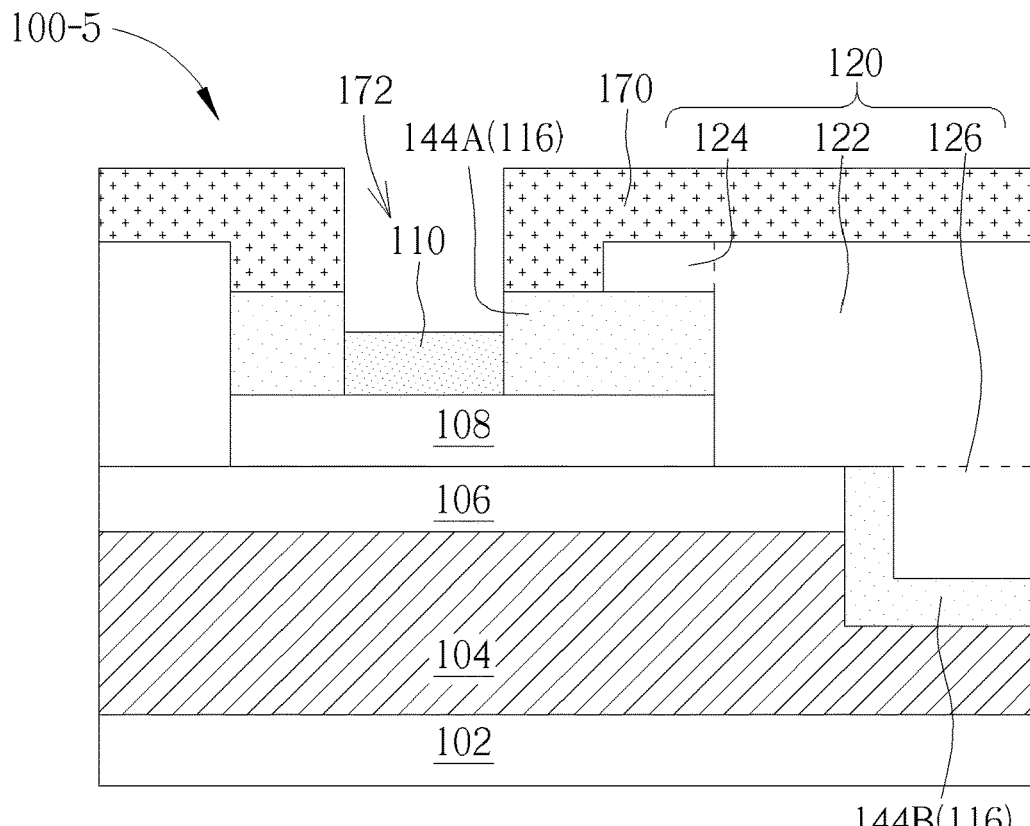
FIG. 9 is a schematic cross-sectional diagram of the structure after exposing the gate capping layer according to one embodiment of the present disclosure.

FIG. 9 is a schematic cross-sectional diagram of the structure after exposing the gate capping layer according to one embodiment of the present disclosure. Referring to FIG. 9, a patterned mask 170 having an opening pattern 172 may be formed, and the dielectric layer 144A exposed from the opening pattern 172 may be etched to thereby expose the gate capping layer 110. Then, a gate electrode 112 may be formed on the gate capping layer 110 by a suitable deposition and etching process to thereby obtain the semiconductor device shown in FIG. 1.

The electrical performance of the semiconductor devices according to some embodiment of the disclosure are further described in the following paragraphs. According to the semiconductor devices 100-1, 100-2, 100-3, 100-4 disclosed in the above embodiments, the horizontal extension portion 124 or the vertical extension portion 126 of the first electrode 120 may be regarded as a field plate for controlling or adjusting the distribution of electric field in the semiconductor barrier layer 108 and the semiconductor channel layer 106. By providing the vertical extension portion 126, the breakdown voltage ($V_{BR}$) of each of the semiconductor devices 100-1, 100-2, 100-3, 100-4 is improved, thus improving the electrical performance of the semiconductor devices 100-1, 100-2, 100-3, 100-4.

Figure 10:
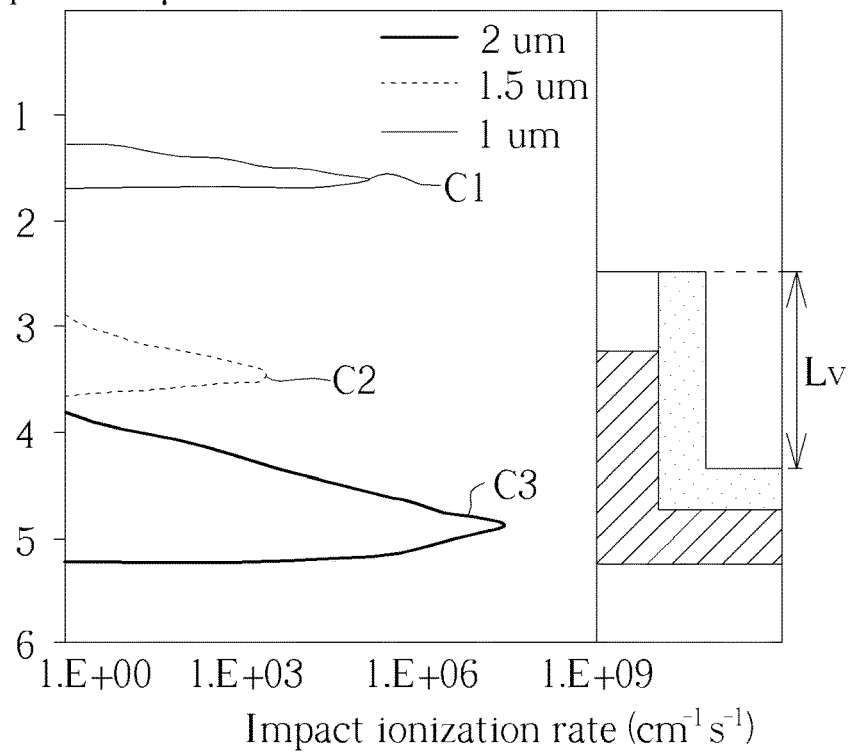
FIG. 10 is a diagram showing the relationship between the electric field and the position in the semiconductor devices according to embodiments and comparative embodiments of the present disclosure.

FIG. 10 is a diagram showing the relationship between the electric field and the position in the semiconductor devices according to embodiments and comparative embodiments of the present disclosure. According to one embodiment of the present disclosure, the vertical length Lv of the vertical extension portion 126 in the semiconductor device 100-1 shown in FIG. 1 may be adjusted, and the impact ionization rate at various depths of the semiconductor device may be measured. The "position" shown in the vertical axis of FIG. 10 refers to a "vertical position", and the position of "0" substantially corresponds to the top surface of the first electrode of the semiconductor device. When the value in the vertical axis becomes larger, the corresponding position becomes more close to the substrate. Referring to FIG. 10, the horizontal length of the horizontal extension electrode may be fixed at 1.5 μm, and the vertical length Lv of the vertical extension portion of the first electrode 120 may be set at 1 μm, 1.5 μm, and 2 μm, respectively. The corresponding curves are represented by the curve C1, the curve C2, and the curve C3, respectively. Referring to FIG. 10, when the vertical length of the vertical extension portion is longer, the peak position of the electric field may become deeper. However, when the bottom surface of the vertical extension portion is located in the semiconductor buffer layer and adjacent to the semiconductor channel layer, the peak intensity of the electric field may be the smallest (corresponding to curve C2). Therefore, by providing the vertical extension portion, the distribution of electric field may be modified so as to reduce the peak value of the electric field. Accordingly, the semiconductor device is less likely to generate impact ionization.

Figure 11:
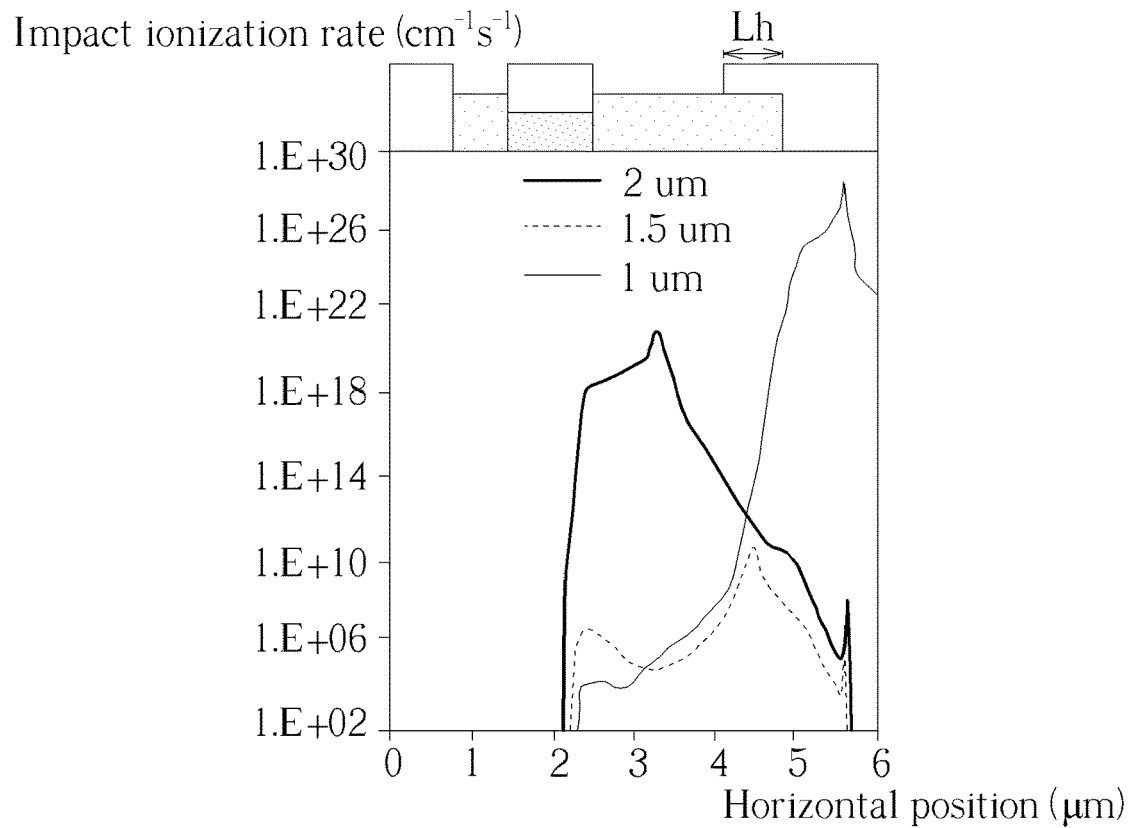
FIG. 11 is a diagram showing the relationship between the electric field and the position in the semiconductor devices of the embodiments and comparative embodiments of the present disclosure.

FIG. 11 is a diagram showing the relationship between the electric field and the position in the semiconductor devices of the embodiments and comparative embodiments of the present disclosure. According to one embodiment of the present disclosure, the horizontal length Lh of the horizontal extension portion 124 in the semiconductor device 100-1 shown in FIG. 1 may be adjusted, and the impact ionization rate at various positions of the semiconductor device may be measured. The "position" in the horizontal axis in FIG. 11 refers to a "horizontal position", and the position of "0" substantially corresponds to one side of the second electrode of the semiconductor device. When the value in the horizontal axis becomes larger, the corresponding position becomes more close to the first electrode. Referring to FIG. 11, the vertical length of the vertical extension electrode may be fixed at 1.5 μm, and the horizontal length Lh of the horizontal extension portion of the first electrode may be set at 1 μm, 1.5 μm and 2 μm. Referring to FIG. 11, when the horizontal length of the horizontal extension portion is longer, the peak position of the electric field becomes closer to the gate electrode, and the peak intensity of the electric field may be reduced. However, when the length of the horizontal extension portion is 1.5 μm, the distribution of electric field shows double peaks, and each peak intensity (≤1E11) is less than any peak intensity of other embodiments. Therefore, by providing the horizontal extension portion, the distribution of electric field may be modified so as to reduce the peak value of the electric field. Accordingly, the semiconductor device is less likely to generate impact ionization.

Figure 12:
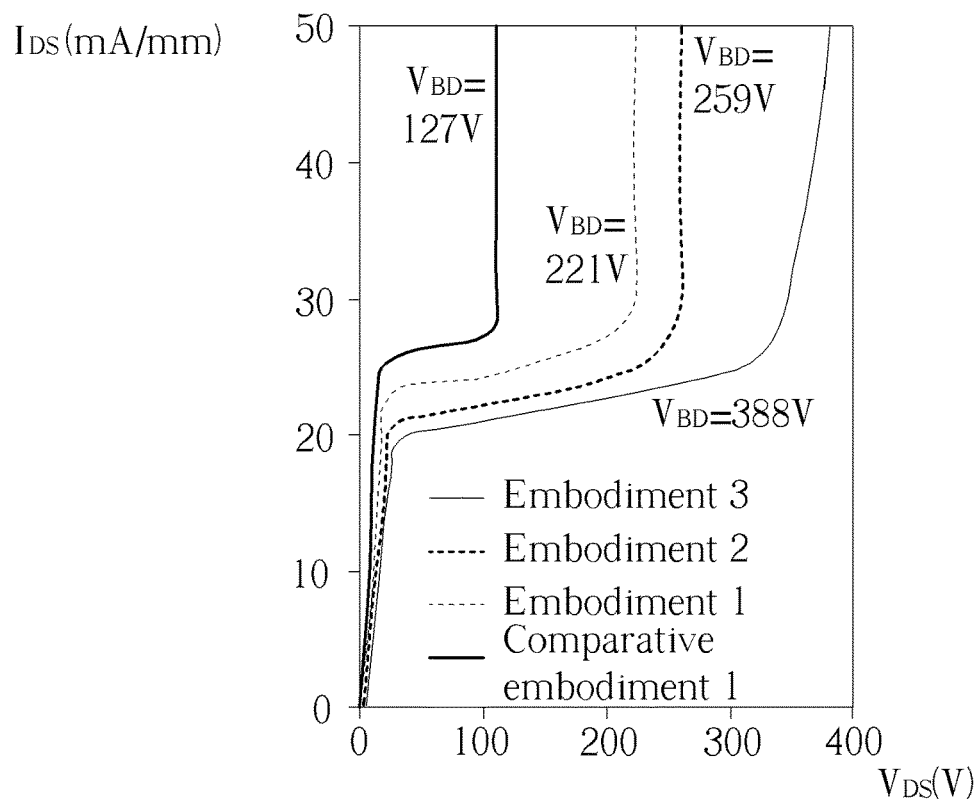
FIG. 12 shows electrical performance regarding $I_{DS}$-$V_{DS}$ and breakdown voltage ($V_{BR}$) of a semiconductor device according to one embodiment of the present disclosure.

FIG. 12 shows electrical performance regarding $I_{DS}$-$V_{DS}$ and breakdown voltage ($V_{BR}$) of a semiconductor device according to one embodiment of the present disclosure. Comparative example 1 corresponds to a conventional semiconductor device, and the first electrode of the comparative example 1 does not include a horizontal extension portion and a vertical extension portion. Embodiment 1 corresponds to the semiconductor device 100-1 of FIG. 1 but without a vertical extension portion; Embodiment 2 corresponds to the semiconductor device 100-1 of FIG. 1 but without a horizontal extension; Embodiment 2 corresponds to the semiconductor device 100-1 shown in FIG. 1 including a vertical extension portion and a horizontal extension portion. Referring to FIG. 12, when $V_{DS}$ is less than 100V, comparative embodiment 1 shows larger $I_{DS}$ than embodiments 1 to 3 do. However, when $V_{DS}$ is greater than 100V, the semiconductor device of comparative embodiment 1 is more likely to be broken down. In contrast, the breakdown voltages of the devices of the embodiments 1 to 3 are 221V, 259V and 388V, respectively, which are higher than the breakdown voltage, which is 127V, of the device of comparative embodiment 1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate;
   forming a semiconductor channel layer on the substrate;
   forming a semiconductor barrier layer on the semiconductor channel layer;
   performing an etching process to expose a portion of the semiconductor channel layer;
   forming a dielectric layer covering the semiconductor barrier layer and the exposed semiconductor channel layer; and
   forming a first electrode after forming the dielectric layer, wherein the first electrode comprises a body portion and a vertical extension portion, the body portion is electrically connected to the semiconductor barrier layer, and a bottom surface of the vertical extension portion is lower than a top surface of the semiconductor channel layer, wherein the first electrode is a conformal layer covers the semiconductor barrier layer and the semiconductor channel layer.

2. The method for fabricating the semiconductor device according to claim 1, wherein the first electrode further comprises a conformal horizontal extension portion covering a portion of the semiconductor barrier layer and a portion of the dielectric layer.

3. The method for fabricating the semiconductor device according to claim 1, further comprising:
   forming a semiconductor buffer layer on the substrate before forming the semiconductor channel layer;
   performing the etching process to expose the portion of the semiconductor channel layer and a portion of the semiconductor buffer layer; and
   forming the dielectric layer covering the semiconductor barrier layer, the exposed semiconductor channel layer and the exposed semiconductor buffer layer.

4. The method for fabricating the semiconductor device according to claim 1, wherein the dielectric layer is in direct contact with the semiconductor buffer layer and the vertical extension portion.

5. The method for fabricating the semiconductor device according to claim 1, wherein a thickness of the dielectric layer is smaller than a vertical length of the vertical extension portion.

6. The method for fabricating a semiconductor device according to claim 1, further comprising:
   etching a portion of the dielectric layer and a portion of the semiconductor barrier layer after forming the dielectric layer;
   depositing a conductive layer on the dielectric layer; and
   patterning the conductive layer to form the first electrode.

* * * * *